United States Patent [19]

Sugawara et al.

[11] 4,122,479
[45] Oct. 24, 1978

[54] OPTOELECTRONIC DEVICE HAVING CONTROL CIRCUIT FOR LIGHT EMITTING ELEMENT AND CIRCUIT FOR LIGHT RECEIVING ELEMENT INTEGRATED IN A SEMICONDUCTOR BODY

[75] Inventors: Yoshitaka Sugawara; Tatsuya Kamei, both of Ibaraki, Japan

[73] Assignee: Hitachi, Ltd., Japan

[21] Appl. No.: 737,267

[22] Filed: Nov. 1, 1976

[30] Foreign Application Priority Data

Nov. 7, 1975 [JP] Japan .................................. 50-13294

[51] Int. Cl.² ............................................ H01L 31/12
[52] U.S. Cl. ...................................... 357/19; 250/551; 357/49; 357/75
[58] Field of Search ...................... 357/19, 17, 75, 49, 357/59; 250/551

[56] References Cited

U.S. PATENT DOCUMENTS

| | | | |
|---|---|---|---|
| 3,393,349 | 7/1968 | Huffman | 357/59 |
| 3,701,043 | 10/1972 | Zuleeg et al. | 357/17 |
| 3,760,242 | 9/1973 | Duffy et al. | 357/49 |
| 3,762,038 | 10/1973 | Ruggiero | 357/49 |
| 3,938,173 | 2/1976 | Jackson et al. | 357/19 |
| 3,946,423 | 3/1976 | Augustine | 357/19 |

OTHER PUBLICATIONS

G. Sideris, "Bumps and Balls, Pillars and Beams: a survey of face-bonding methods", Electronics, Jun. 28, 1965, pp. 68–69.
D. J. Bodendorf, "Active Silicon Chip Carrier", IBM Technical Disclosure Bulletin, vol. 15, No. 2, Jul. 1972, pp. 656–657.

*Primary Examiner*—Stanley D. Miller, Jr.
*Assistant Examiner*—James W. Davie
*Attorney, Agent, or Firm*—Craig & Antonelli

[57] ABSTRACT

An optoelectronic device comprises a light emitting element having a source from which a light signal is emitted, a semiconductor body having a light receiving element, a control circuit for the emitting element, and a circuit for the receiving element which are integrated in the semiconductor body. The light emitting element is electrically connected to the control circuit and optically coupled to the receiving element through a transparent medium for the light signal. The optoelectronic device has an increased integration density and photocoupling efficiency.

18 Claims, 12 Drawing Figures

OPTOELECTRONIC DEVICE HAVING CONTROL CIRCUIT FOR LIGHT EMITTING ELEMENT AND CIRCUIT FOR LIGHT RECEIVING ELEMENT INTEGRATED IN A SEMICONDUCTOR BODY

BACKGROUND OF THE INVENTION

The present invention relates to an optoelectronic device with an increased integration density and an improved photocoupling efficiency.

A photocoupling device essentially comprises a light emitting element and a light receiving element electrically isolated from the emitting element, the light emitting element and light receiving element being made into one unit and being optically coupled to each other. This basic combination is hereinafter referred to as a photocoupler. Since it is easy to form isolation between output and input circuits of the photocouplers, the demand for photocouplers is increasing, particularly in such cases where there is a potential difference between the output and the input or where the introduction of noise into the output or the input should be avoided. It is also desired to increase the integration density and packing density and to obtain devices with high quality and reliability. Therefore, devices in which the input side including a control circuit for the emitting element and the output side including the light receiving element and the circuit therefor are integrated in a semiconductor body are desired.

SUMMARY OF THE INVENTION

Accordingly, an object of the present invention is to provide a new optoelectronic device with an improved integration density and photocoupling efficiency. According to the present invention, there are provided an optoelectronic device in which a control circuit for an emitting element, a receiving element and a circuit for the receiving element are integrated in a semiconductor body and the control circuit is electrically isolated from the receiving element and the circuit, while the emitting element is electrically connected to the emitting element by means of an electro-conductive connection bonding the emitting element to the control circuit in such a manner that each emitting element faces the surface of the corresponding receiving element.

According to one aspect of the present invention a new optoelectronic device is provided which comprises a discrete semiconductor light emitting element having a pn-junction and a light emitting surface for emitting a light signal inherent in the semiconductor in response to an electric signal applied thereto; first electric circuit means, integrated in a semiconductor body, for applying the electric signal to the light emitting element; a semiconductor light receiving element, integrated in the semiconductor body, having a surface by which the light emitting surface of the light emitting element faces and is optically coupled through a medium substantially transparent to the light signal, whereby the light signal is converted into an electric current signal by a pn-junction in the light receiving element; and second electric circuit means, integrated in the semiconductor body, for obtaining an output signal as the electric current signal from the light receiving element in response to the light signal, the light emitting element and the first circuit means being electrically isolated from the light receiving element and second circuit means, wherein the light emitting element has, on the same surface as the light emitting surface, a pair of leads to which the first circuit means is bonded by means of an electro-conductiv connection to define the medium between the surface of the light receiving element and the light emitting surface.

According to another aspect of the present invention, an optoelectronic device is provided which comprises a plurality of discrete semiconductor light emitting elements each having a pn-junction for emitting a light signal inherent in the semiconductor in response to an electric signal applied thereto; first electric circuit means, integrated in a semiconductor body, for applying the electric signal to each of the light emitting elements; a plurality of semiconductor light receiving elements, integrated in the semiconductor body, each having a surface which a corresponding one of said light emitting elements faces and is optically coupled through a medium substantially transparent to the light-signal, whereby the light signal is converted into an electric current signal by a pn-junction in each of the light receiving elements; and second electric circuit means, integrated in the semiconductor body, for obtaining an output as the electric current signal from each of the light receiving elements in response to the light signal, the light emitting elements and first circuit means being electrically isolated from both the light receiving elements and second circuit means, wherein each of the light emitting elements has, on the same surface as the light emitting surface thereof, a pair of leads to which the first circuit means is bonded by means of an electro-conductive connection to define the medium between the surface of each of the light receiving elements and the light emitting surface of the corresponding one of the light emitting elements.

DETAILED DESCRIPTION OF THE PRIOR ART

Figure 1:
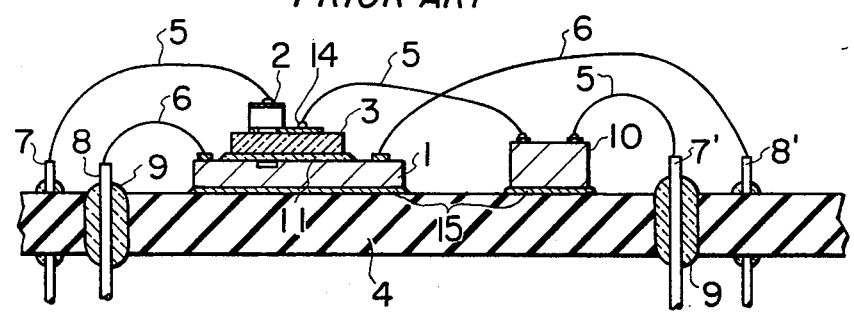
FIGS. 1 and 2 show vertical sectional views of conventional optoelectronic devices which seem relevant to the optoelectronic devices of the present invention.
Figure 2:
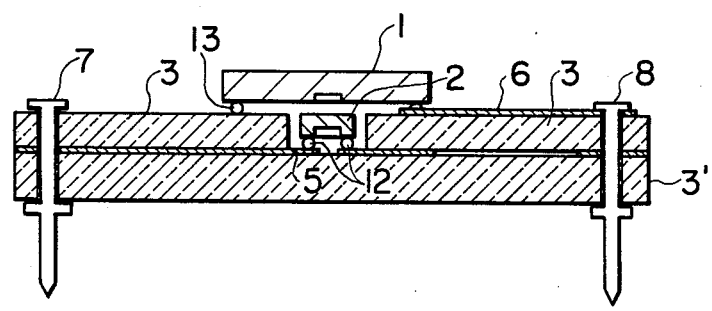

FIGS. 1 and 2 show conventional photocouplers having relatively good quality. In FIG. 1, a light receiving element alone or a light receiving element and a main electrical circuit 1 is mounted on a substrate or stem 4. Light emitting element 2 is mounted on an insulating substrate 3 transparent to a light signal which is emitted from the light emitting element 2. A more detailed description of this type of photocoupler may be found in U.S. Pat. No. 3,535,532 to J. D. Merryman. The emitting element 2 is electrically connected by means of lead wire 5 to control circuit chip 10, which is connected through lead wire 5 connected to wires 7, 7' which penetrate insulator 9 of the stem 4. The light receiving element 1 is connected by means of lead wire 6 to wires 8, 8'.

In this structure, the light emitting element 2 is mounted on the transparent insulating substrate 3, which is bonded by means of a suitable bonding material 11 such as a transparent resin to the light receiving element 1. Since the distance between the elements 1 and 2 is determined by various factors including the thicknesses of the light emitting element 1, the circuit pattern 14 for electrically connecting the light emitting element 2 on the insulating substrate 3, the insulating substrate 3 and the bonding layer 11, it is very difficult to determine the accurate distance between the emitting and receiving elements.

This disadvantage is found in another conventional photocoupler shown in FIG. 2 wherein the same reference numerals refer to the same components as in FIG. 1, while substrate 3, 3' are not necessarily transparent. In this example, emitting element 2 is bonded by means of lead wires of electro-conductor 12 and leads 5 formed on substrate 3', and receiving element 1 is mounted on insulating substrate 3 through electro-conductive connection 13. As has been described above, the distance between the emitting element 2 and receiving element 1 depends on thicknesses of electro-conductors or lead wires 12, element 2, insulating substrate 3 and the electro-conductive connection 13. Therefore, the distance is not easily determined.

It is important to accurately establish the distance between the elements 1 and 2 particularly when a plurality of emitting elements are to be coupled with several receiving elements. If the distance with respect to each pair of an emitting element and a receiving element is different and is not optimum, a desired output or photocoupling efficiency can not be obtained.

Figure 3:
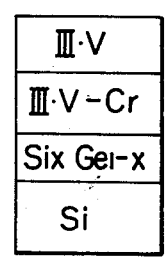
FIGS. 3 and 4 show constructions of conventional light emitting elements made of III-V compound semiconductor materials.
Figure 4:
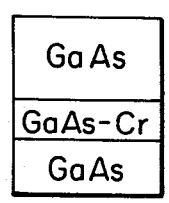

There have been proposed several unitary photocouplers as shown in FIGS. 3 and 4, which are produced by an epitaxital growth process. In FIG. 3 a single crystalline layer of $Si_xGe_{1-x}$ is epitaxially grown on a silicon single crystalline substrate. Then a III-V group compound layer doped with Cr is formed as an insulating layer for isolating the $Si_xGe_{1-x}$ layer (light receiving element) from a III-V group compound layer (light emitting element).

In FIG. 4 an insulating layer of GaAs doped with Cr is formed on a light receiving element consisting of GaAs, and on the insulating layer formed is a light emitting layer consisting of GaAs.

These conventional unitary photocouplers have such disadvantages that insulating properties of the insulating layers are not satisfactory and the photocoupling efficiency is not good because the insulating layer is not completely transparent to a light signal emitted by the emitting layer.

DETAILED DESCRIPTION OF THE INVENTION

The present invention aims at removing these disadvantages. The optoelectronic devices according to the present invention employ a direct connection between a light emitting element and a light receiving element, and control circuit components for the emitting element are integrated in a semiconductor body such as silicon, whereby the distance between the emitting element and receiving element can be minimized and optimized as designed, and the integration density of the device is remarkably increased. In order to isolate the control circuit components integrated in the semiconductor body from both the receiving element and circuit components for the receiving element, various methods are employed which have been known in the field of integrated circuits. Light emitting elements employed in the present invention are made of III-V compound materials which are well known in the art because such materials are considered to have the highest current-light conversion efficiency. The light emitting element is descrete from the light receiving elements and circuit components. As a result, electrical isolation of the emitting element from the receiving element and circuit components for the receiving element is attained by providing an insulation means between the circuit components for the emitting element and the receiving element and circuit components for the receiving elements.

Figure 5:
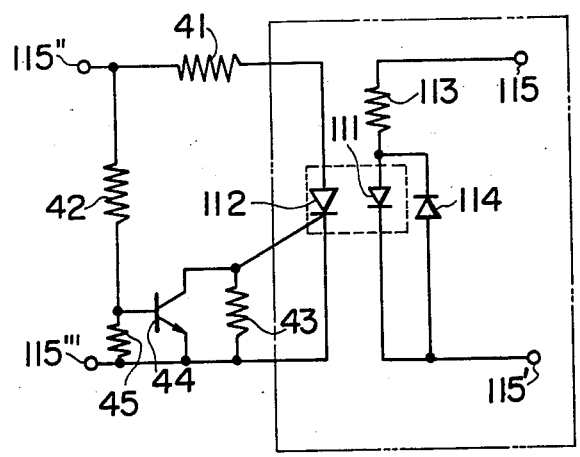
FIG. 5 is an electric circuit diagram showing a part of an electric circuit for an optoelectronic device according to the present invention.

FIG. 5 is an electrical circuit diagram of an optoelectronic device to which the invention is applied. The diagram shows a part of a solid state relay circuit having zero-voltage switching capability. Light emitting diode 111 (hereinafter referred to as LED) and a photothyristor 112 which is optically coupled with the LED constitute a photocoupler surrounded by the dotted line in FIG. 5. Connected to LED 111 are series resistor 113 and opposite juxtaposed zener diode 114 to thereby make the input current constant. Input terminals 115 — 115' of a control circuit for the emitting element or LED and output terminals 115' — 115''' for the receiving element are connected to the circuits, respectively. The circuit at the receiving element side includes resistors 41–43, 45 and transistor 44.

The control circuit for the emitting element essentially comprises means for controlling the input to be constant. For example, zener diode 114 and resistor 114 constitute an essential part of the controlling means. The circuit of the receiving element for obtaining an output essentially comprises means for protecting the thyristor 112 from which an output signal is obtained. For example, transistor 44 and resistor 41–43, 45 constitute an essential part of the protecting means.

Figure 6:
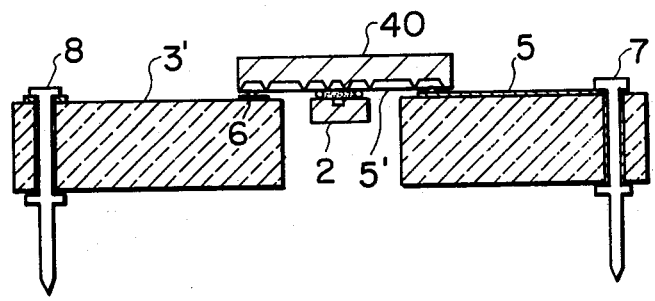
FIGS. 6 and 7 show vertical section views of embodiments of the present invention.
Figure 7:
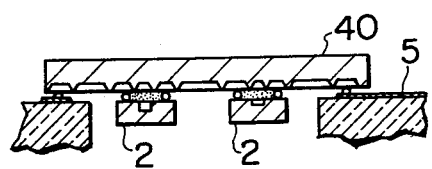

The present invention can be applied to a photocoupling relay of which schematic section views are shown in FIGS. 6 and 7. In FIG. 6, a semiconductor chip 40 is a silicon bipolar integrated circuit formed by isolation techniques known in the art. Receiving elements and an output circuit therefor as well as control circuits for the emitting elements and isolation islands for mounting the emitting elements (LED) are formed and integrated in the chip 40 or a semiconductor body.

The light emitting element 2 is a planar type GaAs diode which is mounted by means of an electroconductive connected on the isolation islands of the chip 40 so that the light emitting surface of the element 2 faces the light sensitive surface of the photothyristor 112. Between the emitting surface and the sensitive surface is an air gap which is preferably filled with a resin transparent to the light signal impinging upon the sensitive surface. In this example, the air gap itself may be used as the medium for transmitting the light signal, but since differences in the refraction indices between air and the surfaces are quite large, the air gap is not the most suitable medium, in general. Among the media above, transparent resins such as silicon resins or epoxy resins are most suitable because it is easy to fill the gap with them when the resins are dissolved in an organic solvent, to avoid occurrence of voids between the medium and the surfaces. Methods and materials for the medium have been known in the art and are disclosed in, for example, Japanese patent Publication No. 11995 of 1968. The chip 40 including the light receiving element and integrated circuits are mounted on an insulating substrate 3' made of, such as, a ceramic material, on which desired printed circuits are formed. Input and output circuits are connected through lead pins 7, 8 to appropriate terminals.

Figure 9:
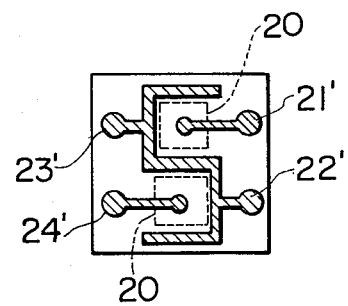
FIG. 9 is a plane view of a light emitting element having two emitting zones exposed on the surface and necessary leads deposited on the surface of a semiconductor.

FIG. 7 shows another embodiment of the present invention in which a pair of light emitting elements 2 each having a pair of light emitting zones as shown in FIG. 9 are bonded by means of an electroconductive connection, such as solder, to semiconductor body 40, while in the embodiment of FIG. 6, only one emitting element as shown in FIG. 9 is bonded to the chip 40. Therefore, in the embodiment of FIG. 7, the chip 40 has a corresponding number of light receiving zones (i.e. 4), control circuits (4), and circuits for the receiving zones (4). It is apparent from the foregoing description that the number of the discrete light emitting elements is increased in accordance with the application of the present invention.

FIG. 9 shows a plane view of a light emitting element having a pair of emitting zones 20, and a pair of input terminals 21', 22', 23', 24'. It goes without saying that only one light emitting zone may be formed in the emitting element.

Figure 8:
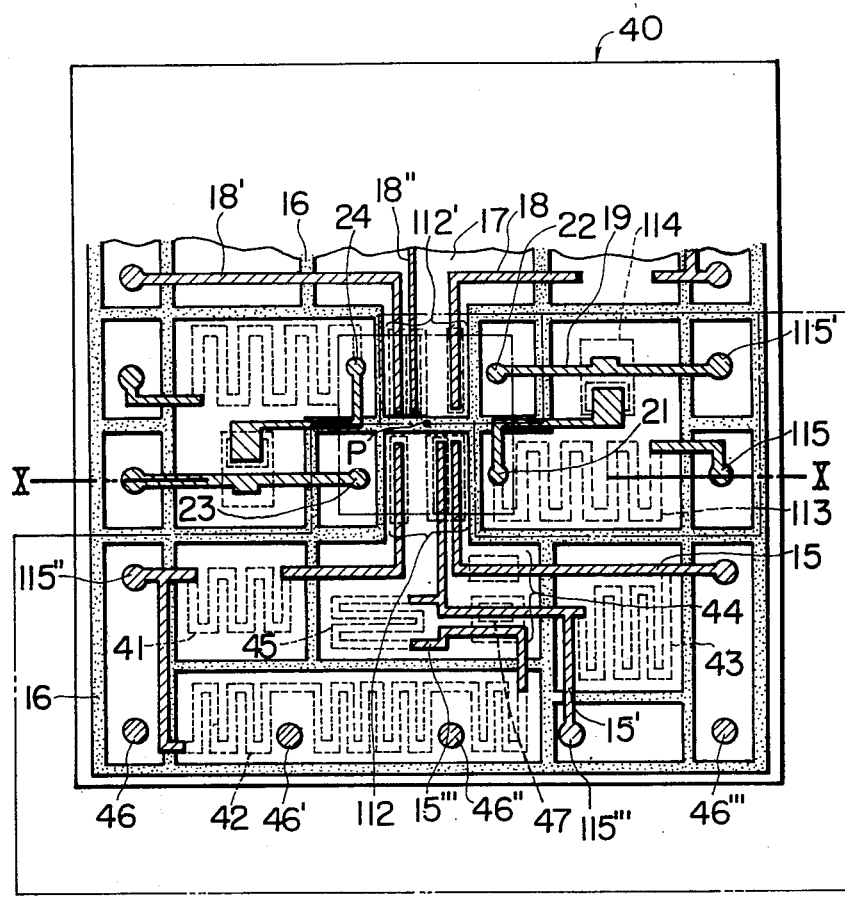
FIG. 8 shows a plane view of an essential part of a semiconductor body shown in FIG. 6.

FIG. 8 shows a partial plane view of chip 40, shown in FIGS. 6 and 7, in which the shaded parts 16 with dots are polycrystalline silicon and blank parts 17 are single crystalline silicon. Between the polycrystalline regions and single crystalline regions is formed an insulating layer 30 such as a silicon dioxide film (see FIGS. 10 and 11). The dotted lines represent end surfaces of doped regions whereby pn-junctions (e.g. 114) and resistors (e.g. 113) are formed in the chip 40. The area indicated by a double-dotted-dashed line corresponds to the part of the circuit confined within the double-dotted-dashed line in FIG. 5. The resistors 41–43, 45 correspond to resistors 41–43, 45 in FIG. 5. The single crystalline silicon is n-type silicon of 9Ω-cm specific resistance; and the lateral photythyristors 112, 112' each comprise a p-type emitter and base each being doped with boron and an n-type emitter doped with phosphor. The resistor 113 of the control circuit for the emitting element is formed by doping boron with a high concentration in an n-type silicon body.

Zener diodes 114 which are oppositely juxtaposed to each other are formed in the same manner as in the formation of p-type base and n-type emitter of the lateral photothyristors 112, 112'.

In FIG. 8, a pair of circuits each having the same arrangement are formed symetrically around the point P. Hatched portions are leads of aluminum formed by a technique such as vapor deposition on the desired parts of the chip 40, hatched portions 18 being connected to the output circuits for the receiving elements and hatched portions 19 being connected to the emitting elements. The n-type emitter 47 of the transistor 44 is formed in contact with lead 115'''. The thyristors 112, 112' each comprise leads 18, 18' in contact with the p-type regions and lead 18'' in contact with the n-type region. The transistor 44 comprises lead 15 in contact with the n-type emitter encircled by a dotted line, lead 15' in contact with the n-type base 47 and lead 15'' in contact with the p-type region.

FIG. 9 shows a plan view of the light emitting diodes 20 facing the lateral photothyristors 112. 112' are zinc-doped GaAs planar diodes, the two portions 20 encircled by dotted lines being doped with zinc and serving as light emitting zones. Leads 21', 22', 23', 24' of the diodes 111 are bonded respectively to leads 21,22,23,24 in FIG. 8 by means of a metallic connection having a melting point lower than the alloying temperature of the lead material such as a aluminum with respect to the III-V compound semiconductor material and silicon. The light emitting surfaces or zones of LED 111 are positioned so accurately that each of the emitting zones faces each of the light sensitive zones of the photothyristor 112, 112'. Metal balls 46, 46', 46'', 46''' made of solder are used for connecting the chip 40 to circuits formed on substrate 3'(see FIG. 6).

One of the essential features of the present invention consists in bonding the light emitting element at the side of the light emitting surface to the light receiving zone of the light emitting element by means of an electroconductive connection. An advantage of this feature is that since the distance between the light emitting zone of the emitting element and the light sensitive zone of the receiving element is determined essentially only by the electro-conductive connection, the designed distance is accurately obtained, so that the desired or designed photocoupling efficiency is obtained.

Since the light emitting element is electro-conductively connected to a semiconductor body in which a light receiving element and its circuit component are integrated, it is isolated from the receiving element and the circuit components for the receiving element. To do this, the present invention can employ suitable isolation techniques which have been known in the art. In an example of the present invention the light emitting element 111 was bonded to the chip 40 by a CCB method (Controlled Collapse Bonding method described in IBM J. Res. Develop. vol. 13, pp. 239 (1969) by L. F. Miller). On the respective bonding terminals 21–24, 21'–24', solder was deposited. Then the solder was melted and cooled to bond the terminals 21–24 to terminals 21'–24'.

Figure 10A:
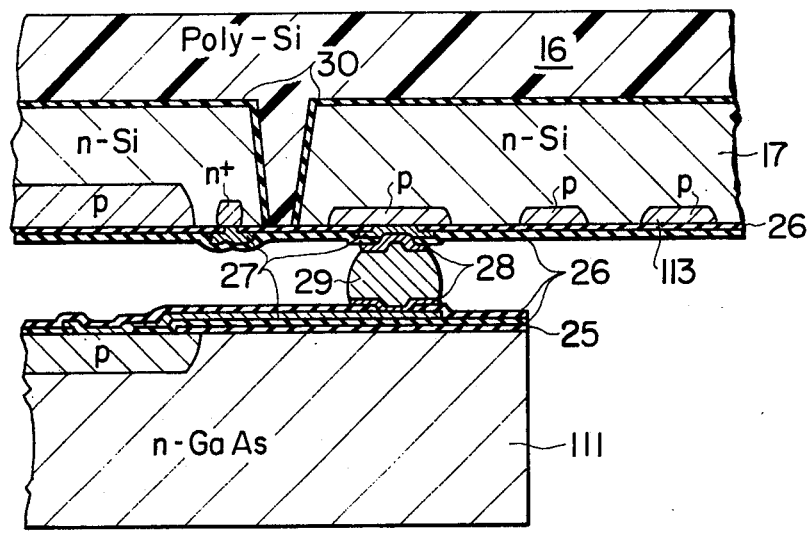
FIG. 10A is a vertical section view of the semiconductor body along the line X—X of FIG. 8.
Figure 11:
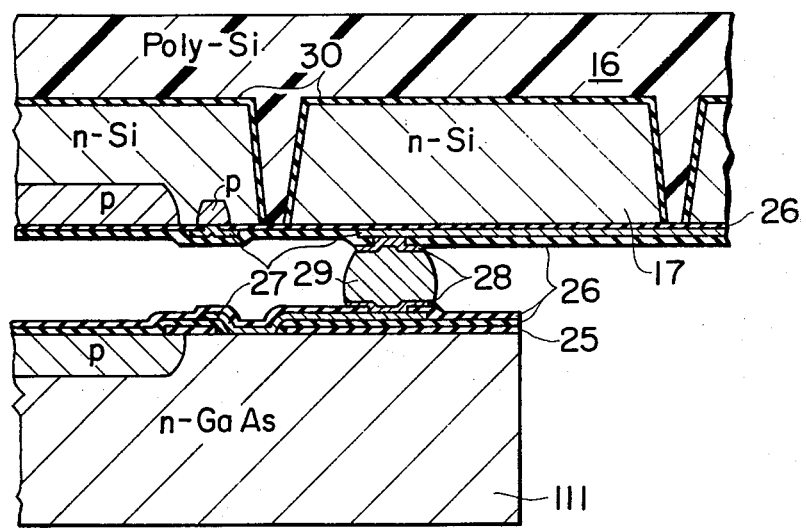
FIG. 11 is a vertical section view of the semiconductor body in another embodiment along the line X—X of FIG. 8.

The electro-conductive connection illustrated in FIGS. 10A and 11 comprises a metallic film layer 28 for limiting the collapse of a low melting point metal material 29 such as a Pb-Sn solder when the low melting point metal material is melted upon heating to bond the chip 40 and LED 111. The metallic film is called BLM in the art. The metallic connection is electrically connected to lead 27 through windows formed in the silicon dioxide films 26. In FIGS. 10A and 11, the air gaps confined by the surface of the chip 40, the surface of the emitting element 111 and the electroconductive connection are filled with a transparent resin (not shown) as shown in FIGS. 6 and 7.

FIG. 10A shows a partial sectional view of the opto-electronic device of the invention along the line X—X of FIG. 8. The p-type GaAs of LED 111 is in ohmic contact with aluminum layer 27-BLM 28-Au-Sn solder 29- BLM 28-aluminum layer 27-a p-type silicon of resistor 113 and opposite juxtapose diodes or zener diodes 114. BLM stands for Ball Limiting Metallization described in IBM J. Res. Develop. supra. A Cr-Cu-Au multilayer was used as BLM in this example.

Figure 10B:
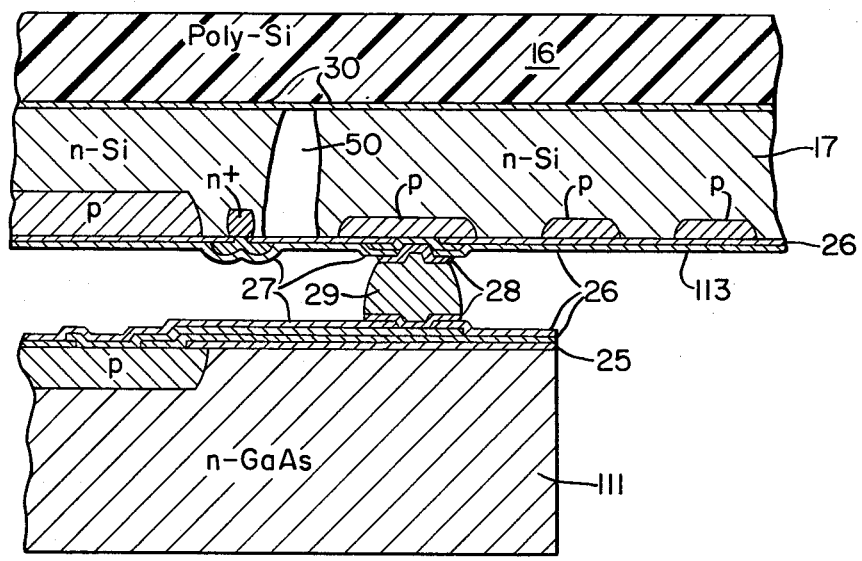
FIG. 10B is a vertical section view similar to FIG. 10A in which a further aspect of the present invention is illustrated.

FIG. 10B shows a structure of the device of the invention, as in FIG. 10A, except that the electrical insulation substance 30 is replaced by an air-gap 50 between the receiving zones, control circuits, and electric circuits.

FIG. 11 shows a partial sectional view in another embodiment, along the line X—X of FIG. 8. The n-type GaAs of LED 111 is in ohmic contact with aluminum layer 27-BLM28-solder 29-BLM28-aluminum layer 27-n-type silicon.

The electro-conductive connection connecting between LED 111 and leads 27 in FIG. 11 is in contact with the surface of a thin silicon dioxide film, while in FIG. 10 the connection and lead 27 are in direct contact with the surface of a single crystalline zone in which resistors 113 are formed. The electro-conductive connection may be connected through resistors 113 to zener diodes 114 as shown in FIG. 8, but may be connected directly to zener diodes 114 in which case resistors 113 are omitted. Further, when the resistors 113 are omitted, an n+-type region may be formed in the n-type region to make a better ohmic contact.

Factors which may affect the accuracy of the distance between the emitting and receiving elements are the deposition layer consisting of aluminum layer 27 and BLM 28, silicon dioxode layer 26 and solder pad 29. In this example the thicknesses of the depositon layer and silicon dioxide layer were about $2\mu$ and $5\mu$, respectively. These layers were formed with a production error of less than 50%. On the other hand, the objective height of the solder pads 29 was $100\mu$, but the actual height of the pads was $100\mu \pm 30\mu$. Therefore, the total production error of this example was $\pm$ about $33.5\mu$.

According to the conventional example shown in FIG. 2, the production error was more than $\pm 150\mu$, because of the boring precision of the insulating substrate 3, variations in thickness of the emitting element 2 and of the lead wires 12 and 6, etc. and in the thickness of the insulating substrate 3. The metallic connection 13 also lowers the precision of the distance. These disadvantages are found in the other example shown in FIG. 1 because there are a number of factors which tend to deteriorate the production precision of the device.

According to the present invention, a discrepancy or disagreement between the light emitting zone and the corresponding light receiving zone can be minimized when the metallic connection is formed by a photoetching technique. Factors which may affect the alignment precision of the emitting and receiving elements are the positions of BLM and lead wires deposited on the semiconductor body. The lead wire position depends on the etching precision by photoetching, of which the etching error is controlled to less than $10\mu$. The BLM position depends on the mask configuration for vapor deposition and mask alignment precision, and the height thereof is controlled to less than $35\mu$. As a consequence, an alignment precision with respect to the emitting element and receiving element can be obtained with a production error of less than $\pm 90\mu$.

With conventional photocouplers shown in FIGS. 1 and 2, the alignment precision was not satisfactory because the production error with the alignment precision was more than $\pm 150\mu$. Such a low alignment precision deteriorates the photocoupling efficiency because only a part of the receiving zone receives a light signal emitted from the emitting element.

According to the present invention, the photocoupling efficiency of the photocoupler is improved or adverse influences which deteriorate the photocoupling efficiency are eliminated or minimized. By virtue of reducing production errors in distance precision between the emitting element and the receiving element and in alignment precision or reducing disagreement between the emitting and receiving elements, the photocoupling efficiency of the optoelectronic device of the invention is remarkably improved.

According to the present invention, it was possible to produce high quality photocouplers with a trigger current of 3mA at high yield (the blocking voltage of the photothyristor was 200 volts, the maximum allowable dv/dt was 100 v/$\mu$s, and the isolating voltage between LED and photothyristors was 700 volts).

As mentioned above, the control circuit for the light emitting element is electrically isolated from the light receiving element and the circuit components therefor in a semiconductor body. In order to isolate the control circuit in the semiconductor body, various techniques are employed. The most suitable and popular technique is a method using a dielectric layer disclosed in "Integrated Circuit" McGraw-Hill (1955), Motorola. Other methods include SOS (Sapphire on Silicon) insulation disclosed in Denda, "Integrated Circuit Technology", the Enginerring Search Associate (1967); air insulation disclosed in Mudge, "Electronics", pp. 65–69 (July 1972) and M. P. Lepselter, "B. S. T. J.", vol 16, page 2 (1960).

In the foregoing description, the electro-conductive connection between the emitting element and the control circuit in the semiconductor body has been explained by way of the CCB method. Other examples of the electro-conductive connection include a pedestal bonding method disclosed in J. S. Cubert, "Proceeding Electronic Component Conference", p. 156 (1966); a bump method disclosed in J. A. Perr, "Electronic", vol. 39, No. 20, pp. 108 (1966); a ball bonding method, disclosed in P. A. Totta, "IBM J. Res. Develop." pp. 226 (1969).

By virtue of employing integrated circuit techniques for isolation of the control circuit for the emitting element, mounting of the photocoupler is very easy, for there is no need to mount the control circuit.

Suitable solder materials for the metallic connection should have a melting point lower than the alloying temperature of the lead material with semiconductor materials. When the material for the lead wires is aluminum and the semiconductor for the chip is silicon, the alloying temperature is about 580° C. Suitable solder materials are solders having a melting point lower than 400° C according to inventors' experience. The solders consist of 1.5 to 70 atomic percent of lead (Pb) and tin (Sn) as balance. A suitable composition of the Pb-Sn solder is 27 atomic percent of lead and tin as balance. These solders have a melting point about 183° C, or lower.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. An optoelectronic device comprising:

a discrete semiconductor light emitting element having a pn-junction and a light emitting surface for emitting a light signal in response to an electric signal applied thereto;

first electric circuit means, integrated in a single semiconductor body, for applying said electric signal to said light emitting element;

a semiconductor light receiving element having an pn-junction, integrated in said semiconductor body, having a surface which faces said light emitting surface of said light emitting element in parallel thereto and is optically coupled thereto through a medium substantially transparent to said light signal, whereby said light signal is converted into an electric current signal by said pn-junction of said light receiving element; and second electric circuit means, integrated in said semiconductor body, for obtaining an output signal as the electric current signal from said light receiving element in response to said light signal;

said first circuit means being electrically isolated from both said light receiving element and said second circuit means in said semiconductor body; and wherein said light emitting element has, on the same surface as said light emitting surface, a pair of leads to which said first circuit means is bonded by means of an electro-conductive connection to define said medium between the surface of said light receiving element and said light emitting surface.

2. An optoelectronic device according to claim 1, wherein said electro-conductive connection includes a metallic material having a melting point lower than the alloying temperature of said leads with respect to said semiconductor.

3. An optoelectronic device according to claim 1, wherein said first and second circuit means and light receiving element are integrated in respective single crystalline zones, which are surrounded by a polycrystalline zone, being isolated, by means of an insulating substance, from said second circuit means and light receiving element.

4. An optoelectronic device according to claim 1, wherein said leads are made of an aluminum film deposited on the desired surface of said semiconductor body and said electro-conductive connection includes solder having a melting point lower than about 400° C.

5. An optoelectronic device comprising:

a plurality of discrete semiconductor light emitting elements each having a pn-junction for emitting a light signal in response to an electric signal applied thereto;

first electric circuit means, integrated in a single semiconductor body, for applying said electric signal to each of said light emitting elements;

a plurality of semiconductor light receiving elements each having a pn-junction, integrated in said semiconductor body, each having a surface in parallel with and facing a corresponding one of said light emitting elements and being optically coupled thereto through a medium substantially transparent to said light signal, whereby said light signal is converted into an electric current signal by the pn-junction in each of said light receiving elements; and second electric circuit means, integrated in said semiconductor body, for obtaining an output as the electric current signal from each of said light receiving elements in response to said light signal, said light emitting elements and first circuit means being electrically isolated from both said light receiving elements and second circuit means, wherein each of said light emitting elements, has, on the same surface as the light emitting surface thereof, a pair of leads to which said first circuit means is bonded by means of an electro-conductive connection to define said medium between the surface of each of said light receiving elements and the light emitting surface of the corresponding one of said light emitting elements.

6. An optoelectronic device according to claim 5, wherein said electro-conductive connection includes a metallic material having a melting point lower than the alloying temperature of said leads with respect to said semiconductors.

7. An optoelectronic device according to claim 5, wherein said first and second circuit means and light receiving elements are formed in single crystalline zones of said semiconductor body, which are surrounded by a polycrystalline zone being isolated, by means of an insulating substance, from said second circuit means and light receiving elements.

8. An optoelectronic device according to claim 5, wherein said leads are made of an aluminum film deposited on the desired surface of said semiconductor body and said electro-conductive connection includes solder having a melting point lower than about 400° C.

9. An optoelectronic device comprising:

a plurality of discrete semiconductor light emitting elements each having a plurality of light emitting zones formed by a p-type region and an adjacent n-type region, whereby each of said light emitting zones emits a light signal in response to an electric signal, each of said light emitting zones having leads through which said electric signal is applied and which are formed on one surface of said light emitting elements where said light signal is emitted;

first electric circuit means corresponding to each of said light emitting elements integrated in a single semiconductor body for applying said electric signal through said leads to each of said light emitting zones, said first circuit means comprising a controlling circuit integrated in said semiconductor body and leads formed on said one surfaces of said light emitting elements and said semiconductor body;

a plurality of semiconductor light receiving elements, integrated in said semiconductor body and electrically isolated from both said light emitting elements and first electric circuit means, each having a light receiving zone formed by a p-type region and an adjacent n-type region, whereby said light signal impinging the surface of said light receiving zone is converted into an electric current signal, each zone facing in parallel with and being optically coupled to the surface of a corresponding light emitting zone through a medium substantially transparent to said light signal, each of said light receiving elements comprising leads formed on said one surface of said semiconductor body; and second electric circuit means, corresponding to each of said light receiving elements, integrated in said semiconductor body and electrically isolated from both said light emitting elements and first circuit means, said second circuit means comprising means for obtaining an output signal as the electric current signal from each of said light emitting elements, in response to said light signal, and leads which are formed on said one surface and are connected to said light emitting elements and the leads of said first circuit means are electrically connected by means of an electro-conductive connection so as to define said medium between said light emitting zones and corresponding light receiving zones.

10. An optoelectronic device according to claim 9, wherein said first and second circuit means and light receiving elements are formed in single crystalline zones of said semiconductor body and said single crystalline zones are isolated, by means of an insulating substance, from a polycrystalline zone surrounding said single crystalline zones and from both said second circuit means and light receiving elements.

11. An optoelectronic device according to claim 9, wherein said leads are made of an aluminum film deposited on the desired surface of said semiconductor body and said electro-conductive connection includes solder having a melting point lower than about 400° C.

12. An optoelectronic device comprising:
   at least one light emitting element made of a compound semiconductor material and having a flat surface to which an edge of a pn-junction is exposed;
   at least one respective light receiving element formed in a single body of silicon, and having a pn-junction the surface of which is disposed apart from and in parallel with the surface of said light emitting element, said light receiving element being electrically isolated from but optically coupled to said light emitting through a medium being defined between the parallel surfaces and substantially transparent to said light signal;
   first means, electrically connected to said light emitting element and formed in said silicon body, for applying an electric signal to said light emitting element through the leads of said light emitting element; and
   second means for obtaining an output as an electric signal from said light receiving element in response to said light signal; and
   wherein said leads of said light emitting element are bonded by means of a metallic connection to the leads of said first means formed on the surface of said silicon body.

13. An optoelectronic device comprising:
   a discrete element made of a III-V compound semiconductor material and having a plurality of light emitting zones comprising pn-junctions each of which is formed by a p-type region and an adjacent n-type region and has an edge of each of said pn-junctions exposed to one surface of said element wherein each of said emitting zones has a pair of leads formed on said one surface;
   a single semiconductor body having a main surface and comprising a plurality of light receiving zones corresponding to the respective emitting zones and integrated in single crystalline zones of said semiconductor body, each of said receiving zones having a pn-junction, an edge of which is exposed to said main surface and said one surface of said element faces said main surface of said semiconductor body, whereby each of said emitting zones faces a respective one of said receiving zones;
   control circuits, integrated in single crystalline zones of said semiconductor body, for applying an electric signal to each of said emitting zones, wherein each of said leads is electrically connected to a respective one of said control circuits through a metallic connection to define said medium between said one surface and said main surface;
   electrical circuits, integrated in said semiconductor body, to which the respective receiving zones are electrically connected for obtaining an electric signal from said receiving zones,
   first means, formed on said main surface, for electrically connecting said metallic connection to said control circuits; and
   second means, formed on said main surface, for electrically connecting said receiving zones to the respective electrical circuits; and
   wherein each of said single crystalline zones in which each of said receiving zones, control circuits and electrical circuits is separately formed is surrounded by a polycrystalline zone in a manner that said single crystalline zones are electrically isolated from said polycrystalline zone by means of an electrical insulating substance.

14. An optoelectronic device according to claim 13, wherein said electrical insulation substance is a silicon dioxide layer.

15. An optoelectronic device according to claim 13, wherein said electrical insulation substance is an air gap formed between said receiving zones, control circuits and said electric circuits.

16. An optoelectronic device according to claim 13, wherein said metallic connection includes solder having a melting point lower than about 400° C. and said leads and first and second means include aluminum film deposited on said one surface and said one main surface.

17. An optoelectronic device according to claim 13, wherein said first and second means are formed in contact with the surfaces of said receiving zones, control circuits and electrical circuits, while the remainder of the main surface and the entire surface including said first and second means are covered with a silicon dioxide film.

18. An optoelectronic device according to claim 13, wherein said first and second means are in direct contact with the surfaces of said single crystalline zones on said main surface.

* * * * *